United States Patent
Lu

(10) Patent No.: US 11,302,594 B2
(45) Date of Patent: Apr. 12, 2022

(54) SEMICONDUCTOR PACKAGE AND METHOD OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/738,763

(22) Filed: Jan. 9, 2020

(65) Prior Publication Data

US 2021/0217677 A1 Jul. 15, 2021

(51) Int. Cl.
| | |
|---|---|
| *H01L 23/31* | (2006.01) |
| *H01L 49/02* | (2006.01) |
| *H01L 27/01* | (2006.01) |
| *H01L 21/56* | (2006.01) |

(52) U.S. Cl.
CPC .......... *H01L 23/3192* (2013.01); *H01L 21/56* (2013.01); *H01L 27/01* (2013.01); *H01L 28/40* (2013.01)

(58) Field of Classification Search
CPC ..... H01L 23/3192; H01L 27/01; H01L 28/40; H01L 21/56
See application file for complete search history.

(56) References Cited

U.S. PATENT DOCUMENTS

| | | | | |
|---|---|---|---|---|
| 5,506,444 | A * | 4/1996 | Chikawa | H01L 21/56 257/666 |
| 8,293,336 | B2 * | 10/2012 | Craamer | D06P 5/30 427/466 |
| 9,921,699 | B2 * | 3/2018 | Chung | G06F 3/04164 |
| 10,730,074 | B2 * | 8/2020 | Stevenson | B06B 1/0622 |
| 2002/0097001 | A1 * | 7/2002 | Jenekhe | H01L 51/5036 315/169.3 |
| 2008/0057221 | A1 * | 3/2008 | Boyd | H01L 21/67225 427/569 |
| 2011/0242746 | A1 * | 10/2011 | Hoffman | H05K 7/20009 361/679.02 |
| 2014/0206826 | A1 * | 7/2014 | Isahaya | C08G 64/18 525/462 |
| 2014/0361430 | A1 * | 12/2014 | Ono | H01L 23/49816 257/737 |
| 2017/0293194 | A1 * | 10/2017 | Hou | G06F 1/1626 |
| 2019/0256715 | A1 * | 8/2019 | Ahmad | C08L 27/12 |
| 2020/0300814 | A1 * | 9/2020 | Eisaman | G01N 29/14 |

\* cited by examiner

*Primary Examiner* — Seahvosh Nikmanesh
(74) *Attorney, Agent, or Firm* — Foley & Lardner LLP

(57) ABSTRACT

A semiconductor package includes a substrate, an electronic component and a first dilatant layer. The electronic component is disposed on the substrate. The electronic component has a top surface, a bottom surface opposite to the top surface and a lateral surface extending between the top surface and the bottom surface. The first dilatant layer is disposed on the top surface of the electronic component and extends along the lateral surface of the electronic component.

19 Claims, 18 Drawing Sheets

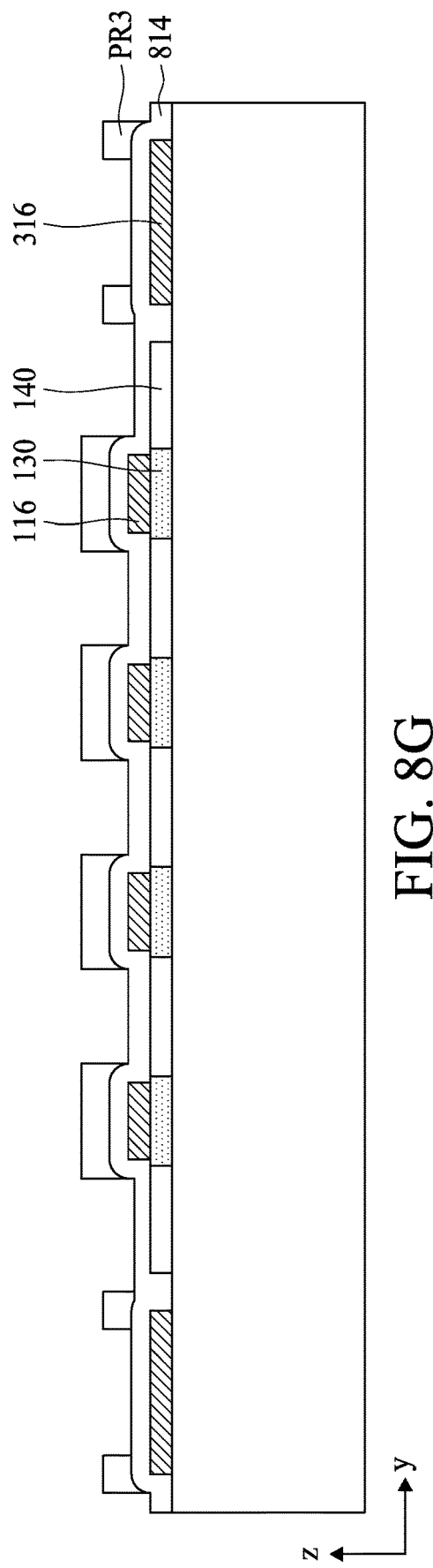
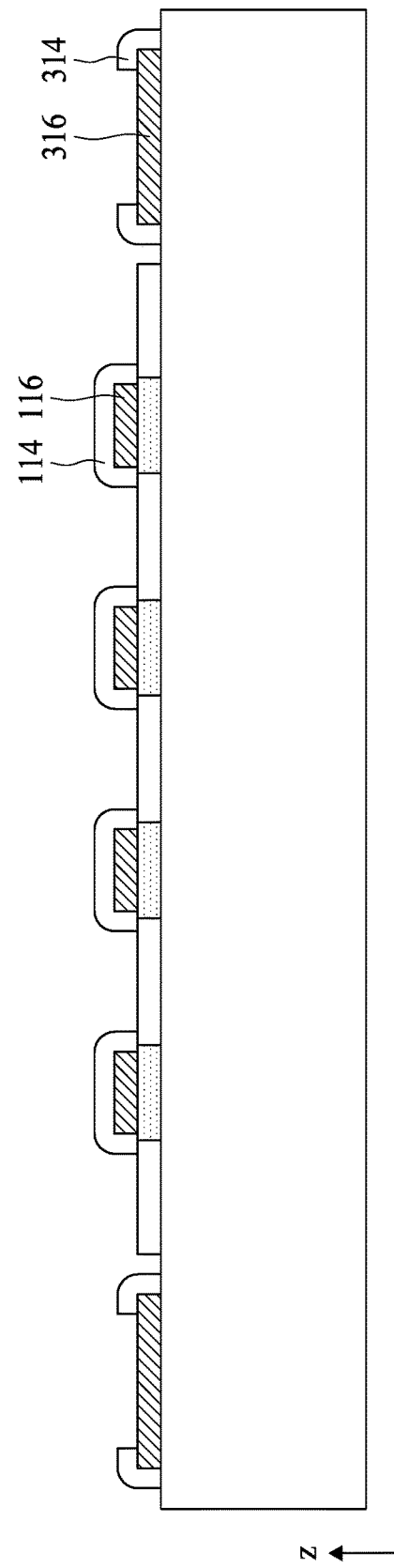
FIG. 8G
FIG. 8H

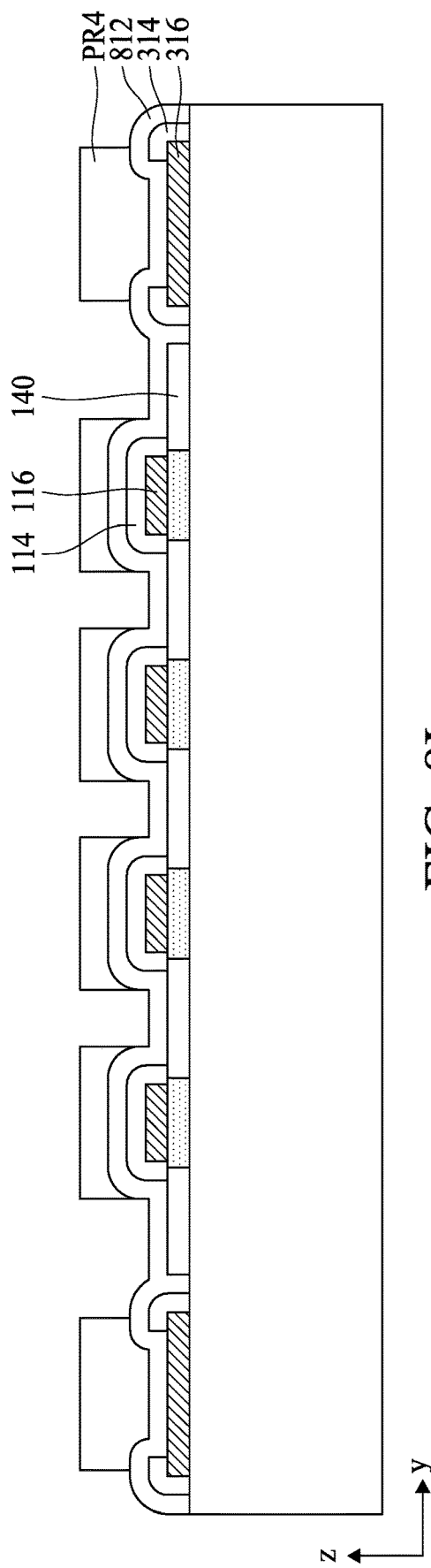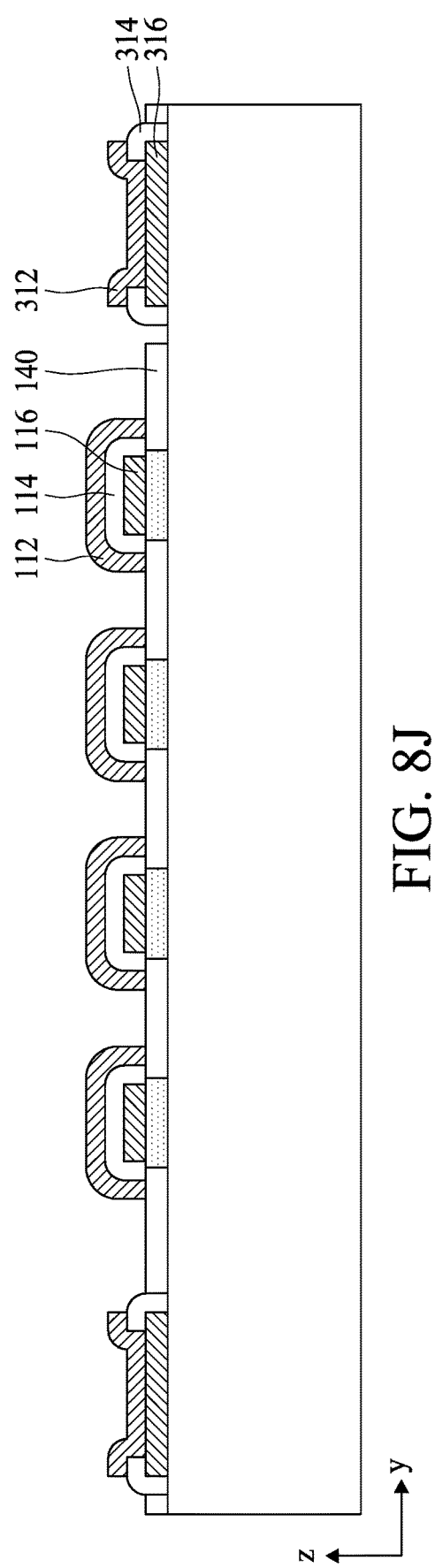

SEMICONDUCTOR PACKAGE AND METHOD OF MANUFACTURING THE SAME

BACKGROUND

1. Technical Field

The present disclosure relates generally to a semiconductor package and a method of manufacturing the same. More particularly, the present disclosure relates to a semiconductor package including a dilatant layer and a method of manufacturing the same.

2. Description of the Related Art

With the advancements in miniaturization and the increased number of I/O terminals of electronic devices, there has been a desire to thin-down the electronic devices without undermining the expected performance. For example, capacitors may be integrated into a single package/chip/die (e.g., integrated passive device, IPD) to achieve a higher capacitance while retaining a reduced overall thickness of the capacitors.

However, since the capacitance decreases with the increase of the overall thickness of the capacitors—resulting from an increase in temperature—it has become a challenge to control variation in the overall thickness of the capacitors, and provide IPDs having stable and reliable electrical properties.

SUMMARY

In one or more embodiments, a semiconductor package includes a substrate, an electronic component and a first dilatant layer. The electronic component is disposed on the substrate. The electronic component has a top surface, a bottom surface opposite to the top surface and a lateral surface extending between the top surface and the bottom surface. The first dilatant layer is disposed on the top surface of the electronic component and extends along the lateral surface of the electronic component.

In one or more embodiments, a semiconductor package includes a substrate, an electronic component and a first dilatant layer. The electronic component is disposed on the substrate. The electronic component includes a first conductive layer, a dielectric layer and a second conductive layer. The first conductive layer is disposed on the substrate. The dielectric layer is disposed on the first conductive layer and surrounds the first conductive layer. The second conductive layer is disposed on the dielectric layer and surrounds the dielectric layer. The first dilatant layer is disposed on the second conductive layer of the electronic component. The first dilatant layer has a coefficient of thermal expansion (CTE) greater than a CTE of the second conductive layer.

In one or more embodiments, a method for manufacturing a semiconductor device package includes: providing a substrate; forming a first conductive layer on the substrate; forming a dielectric layer on the first conductive layer; forming a second conductive layer on the dielectric layer; and forming a first dilatant layer on the second conductive layer. A CTE of the first dilatant layer is greater than a CTE of the second conductive layer.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 8A, FIG. 8B, FIG. 8C, FIG. 8D, FIG. 8E, FIG. 8F, FIG. 8G, FIG. 8H, FIG. 8I, FIG. 8J, FIG. 8K, FIG. 8L, FIG. 8M, FIG. 8N, FIG. 8O and FIG. 8P illustrate a method of manufacturing a semiconductor package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
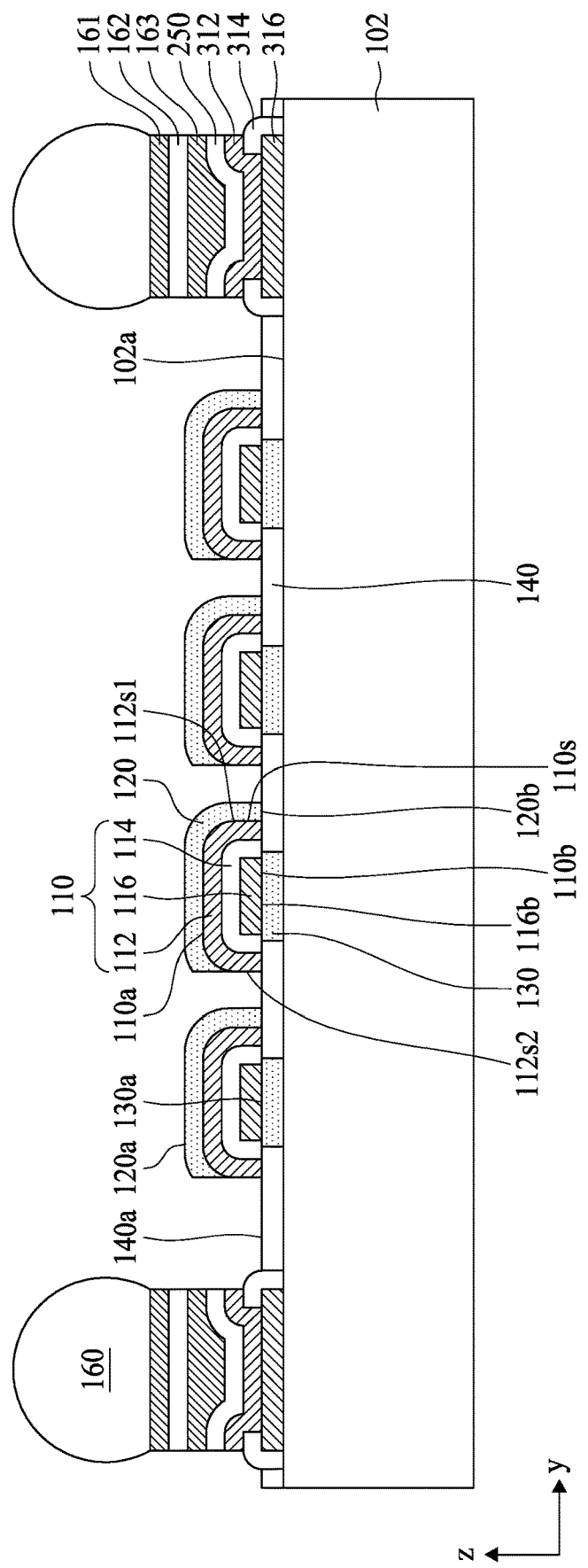
FIG. 1 illustrates a cross-sectional view of a semiconductor package in accordance with some embodiments of the present disclosure.

FIG. 1 illustrates a cross-sectional view of a semiconductor package 100 in accordance with some embodiments of the present disclosure. The semiconductor package 100 includes a substrate 102, an electronic component 110, dilatant layers 120 and 130, an insulation layer 140 and an electrical contact 160.

In some embodiments, the substrate 102 is formed of or includes one or more organic materials (e.g., a molding compound, a bismaleimide triazine (BT) resin, polyimide (PI), polybenzoxazol (PBO), a solder resist, an Ajinomoto build-up film (ABF), polypropylene (PP), an epoxy-based material, FR4, or a combination of two or more thereof) or inorganic materials (e.g., silicon, glass, ceramic, quartz, sapphire, silicon oxide, silicon nitride, or a combination of two or more thereof). In some embodiments, a thickness of the substrate 102 is in a range from about 25 µm to about 100 µm. In some embodiments, the substrate 102 can be referred to as a carrier of the semiconductor package 100. The substrate 102 may include an interconnection structure, such as a redistribution layer (RDL) or a grounding element. The substrate 102 may include one or more conductive pads in proximity to, adjacent to, or embedded in and exposed at a surface 102a of the substrate 102. The substrate 102 may include a solder resist (or solder mask) on the surface 102a of the substrate 102 to fully expose or to expose at least a portion of the conductive pads for electrical connections.

The electronic component 110 is disposed on the substrate 102. The electronic component 110 has a surface 110a (also referred to as "a top surface"), a surface 110b (also referred to as "a bottom surface") opposite to the surface 110a and a surface 110s (also referred to as "a lateral surface") extending between the surface 110a and the surface 110b. In some embodiments, the electronic component 110 includes conductive layers 112 and 116 and a dielectric layer 114. In some embodiments, the conductive layer 116 is disposed on the substrate 102. In some embodiments, the dielectric layer 114 is disposed between the conductive layer 112 and the conductive layer 116. In some embodiments, the dielectric layer 114 is disposed on the conductive layer 116 and surrounds the conductive layer 116. In some embodiments, the conductive layer 112 is disposed on the dielectric layer 114 and surrounds the dielectric layer 114. In some embodiments, a coefficient of thermal expansion (CTE) of the conductive layer 112 is greater than a CTE of the dielectric layer 114. In some embodiments, a CTE of the conductive layer 116 is greater than the CTE of the dielectric layer 114. In some embodiments, the electronic component 110 may be or include a capacitor.

The dilatant layer 120 is disposed on the top surface (e.g., the surface 110a) of the electronic component 110 and extends along the lateral surface (e.g., the surface 110s) of the electronic component 110. In some embodiments, the dilatant layer 120 directly contacts the substrate 102 or the insulation layer 140. For example, the dilatant layer 120 is attached to or adhered to the substrate 102 or the insulation layer 140. In some embodiments, the dilatant layer 120 may be omitted. However, an increase in temperature (e.g., during a heating operation) may cause thermal expansion of the dielectric layer 114 of the electronic component 110. For example, the thickness of the dielectric layer 114 may increase along with the increase in temperature; thereby the dielectric constant of the dielectric layer 114 may decrease, which may result in the decrease of the capacitance of the electronic component 110. In accordance with the embodiments as shown in FIG. 1, the dilatant layer 120 on the top surface and extending along the lateral surface of the electronic component 110 to contact with the substrate 102 or the insulation layer 140 may compress the dielectric layer 114 of the electronic component 110 both in the y-direction and the z-direction, particularly the z-direction, when the temperature rises. The compression force applied from the dilatant layer 120 on the electronic component 110 may restrict the thermal expansion of the dielectric layer 114 and help to avoid undesired decrease of the capacitance of the electronic component 110.

In some embodiments, the dilatant layer 120 fully covers the surface 110a of the electronic component 110. In some embodiments, the dilatant layer 120 fully covers the surface 110s of the electronic component 110. In some embodiments, the dilatant layer 120 surrounds the surface 110a and the surface 110s of the electronic component 110. With the abovementioned one or more arrangements, the dilatant layer 120 may apply compression force covering a relatively large surface area of the electronic component 110. Thus, the effect of avoiding undesired decrease of the capacitance of the electronic component 110 may be enhanced.

In some embodiments, the dilatant layer 120 is in direct contact with at least a portion of the surface 110a and at least a portion of the surface 110s. In some embodiments, the dilatant layer 120 is in direct contact with the entire surface 110a of the electronic component 110. In some embodiments, the dilatant layer 120 is in direct contact with the entire surface 110s of the electronic component 110. With the abovementioned one or more arrangements, the adhesion strength between the dilatant layer 120 and the electronic component 110 may be increased, such that the dilatant layer 120 may anchor on the electronic component 110 and apply compression force on the electronic component 110 more effectively. Thus, the effect of avoiding undesired decrease of the capacitance of the electronic component 110 may be enhanced.

In some embodiments, the dilatant layer 120 extends along a surface 112s1 (also referred to as "a lateral surface") of the conductive layer 112 and covers at least a portion of the surface 112s1 of the conductive layer 112. In some embodiments, the dilatant layer 120 fully covers the surface 112s1 of the conductive layer 112. In some embodiments, the conductive layer 112 has a surface 112s2 (also referred to as "a lateral surface") opposite to the surface 112s1, and the surface 112s2 is exposed from the dilatant layer 120. In some embodiments, a surface 120b (also referred to as "a bottom surface") of the dilatant layer 120 is substantially coplanar with a surface 116b (also referred to as "a bottom surface") of the conductive layer 116.

In some embodiments, the dilatant layer 120 has a CTE greater than the CTE of the conductive layer 112. In some embodiments, the CTE of the dilatant layer 120 is greater than the CTE of the dielectric layer 114. The thickness of the dielectric layer 114 may be greatly increased as the temperature rises, which may lead to an undesired decrease of the capacitance of the electronic component 110. The design of the CTE of the dilatant layer 120 (e.g., the CTE of the dilatant layer 120 being greater than that of the dielectric layer 114) may significantly reduce the expansion of the thickness of the dielectric layer 114, and thus the capacitance value undesirably varying with the change of the temperature may be inhibited. In addition, the decrease of the dielectric constant of the dielectric layer 114 along with the increase of the temperature can be compensated for as well.

The dilatant layer 130 is disposed between the conductive layer 116 and the substrate 102. In some embodiments, the dilatant layer 130 is in contact with the conductive layer 116. In some embodiments, the dilatant layer 120 and the dilatant layer 130 are formed of the same material. In alternative embodiments, the dilatant layer 120 and the dilatant layer 130 are formed of different materials. In some embodiments, the dilatant layer 130 has a CTE that is different from the CTE of the dilatant layer 120. In alternative embodiments, the CTE of the dilatant layer 130 is the substantially equal to that of the dilatant layer 120. In some embodiments, the CTE of the dilatant layer 130 is greater than the CTE of the dielectric layer 114. In some embodiments, the CTE of the dilatant layer 130 is greater the CTE of the conductive layer 116. With the abovementioned one or more arrangements of the dilatant layers 120 and 130, the electronic component 110 may be sandwiched between the dilatant layer 120 and the dilatant layer 130, and the force applied from the dilatant layer 120 and the dilatant layer 130 downwardly and upwardly on the dielectric layer 114 may help to further reduce the possible increase of the thickness of the electronic component 110 as the temperature rises.

In some embodiments, the dilatant layer 120 has a cross-sectional area (also referred to as "a first cross-sectional area") along a line perpendicular to the surface 102a of the substrate 102, and the dilatant layer 130 has a cross-sectional area (also referred to as "a second cross-sectional area") along the line perpendicular to the surface 102a of the substrate. The cross-sectional area of the dilatant layer 120 is greater than the cross-sectional area of the dilatant layer 130. For example, a projection of the dilatant layer 130 on the surface 102a of the substrate 102 is included in a projection of the dilatant layer 120 on the surface 102a of the substrate 102. In some embodiments, the dilatant layer 130 is isolated from the dilatant layer 120. Alternatively, the dilatant layer 130 is in contact with the dilatant layer 120.

In some embodiments, the cross-sectional area of the dilatant layer 130 is equal to or less than a cross-sectional area of the electronic component 110 along a line perpendicular to the surface 102a of the substrate 102. For example, a projection area of the dilatant layer 130 on the surface 102a of the substrate 102 is equal to or less than a projection area of the electronic component 110 on the surface 102a of the substrate 102.

The insulation layer 140 is disposed on the substrate 102 and adjacent to the dilatant layer 130. In some embodiments, the insulation layer 140 is disposed on the substrate 102 and surrounds the dilatant layer 130. In some embodiments, the insulation layer 140 is in contact with the dilatant layer 130. In some embodiments, the insulation layer 140 is in contact with the dilatant layer 120. In some embodiments, the insulation layer 140 is in contact with the dielectric layer 114 and the conductive layer 112. In some embodiments, the insulation layer 140 has a CTE that is less than the CTE of the dilatant layer 130. Thus, the expansion of the dilatant layer 130 may be greater than the expansion of the insulation layer 140 when the temperature rises, such that the dielectric layer 114 may be compressed by the dilatant layer 130 more effectively and significantly.

In some embodiments, a surface 140a (also referred to as "a top surface") of the insulation layer 140 is substantially coplanar with a surface 130a (also referred to as "a top surface") of the dilatant layer 130. In some other embodiments, the semiconductor package can be free from the insulation layer 140, thus the dielectric layer 114 and the conductive layer 112 are in direct contact with the surface 102a of the substrate 102.

The electrical contact 160 is disposed on the surface 102a of the substrate 102 and electrically connected to the electronic component 110 through one or more conductive layers 161, 163, 312 and 316. In some embodiments, the conductive layer 316 is in contact with the surface 102a of the substrate 102, and the conductive layer 312 (also referred to as "a conductive via") is disposed on the conductive layer 316. In some embodiments, a dielectric layer 314 is disposed adjacent to the conductive layers 312 and 316. In some embodiments, a seed layer 250 is disposed on the conductive layer 316, and the conductive layer 163 is disposed on the seed layer 250. In some embodiments, a barrier layer 162 is disposed on the conductive layer 163, and the conductive layer 161 is disposed on the barrier layer 162. In some embodiments, the electrical contact 160 is disposed on the conductive layer 161 and electrically connected to the conductive layers 112 and 116 of the electronic component 110.

In some embodiments, the electrical contact 160 is a Controlled Collapse Chip Connection (C4), a Ball Grid Array (BGA), a Land Grid Array (LGA) or a bump. In alternative embodiments, the electrical contact 160 is a metal pillar. In some embodiments, the electrical contact 160 can be used for a fan-in structure, a fan-out structure or a combination of the fan-in and fan-out structure.

In some embodiments, the conductive layer 112, 116, 312 or 316 is formed of or includes graphene, graphene, gold (Au), silver (Ag), copper (Cu), platinum (Pt), palladium (Pd), other metal(s) or alloy(s), or a combination of two or more thereof. In some embodiments, the conductive layer 161 or 163 is formed of or includes gold (Au), silver (Ag), copper (Cu), platinum (Pt), palladium (Pd), other metal(s) or alloy(s), or a combination of two or more thereof. In some embodiments, the dielectric layer 114 or 314 is formed of or includes PI, epoxy resin, ABF, PBO, titanium oxide ($Ti_2O_5$), silicon oxide ($SiO_2$), silicon nitride ($Si_3N_4$), or a combination of two or more thereof. In some embodiments, the barrier layer 162 is formed of or includes nickel (Ni), titanium (Ti), tungsten (W), platinum (Pt), other metal(s) or alloy(s), or a combination of two or more thereof. In some embodiments, the seed layer 250 is formed of or includes Ti, Cu or alloy(s). In some embodiments, a thickness of the conductive layer 112, 116, 312 or 316 is in a range from about 0.1 μm to about 0.5 μm, from about 0.1 μm to about 0.2 μm, or from about 1 nm to about 5 nm. In some embodiments, a thickness of the dielectric layer 114 or 314 is in a range from about 0.2 μm to about 0.5 μm. In some embodiments, a thickness of the barrier layer 162 is in a range from about 0.1 μm to about 0.2 μm. In some embodiments, a thickness of the seed layer 250 is in a range from about 0.1 μm to about 0.2 μm.

In some embodiments as shown in FIG. 1, the semiconductor package 100 includes a pair of electrical contacts 160, and one or more electronic components 110 with the dilatant layers 120 and 130 disposed thereon are between the electrical contacts 160. In some other embodiments, the semiconductor package includes three or more electrical contacts 160, and one or more electronic components 110 with the dilatant layers 120 and 130 disposed thereon are arranged between every two electronic components 110 of these electronic components 110. In some embodiments as shown in FIG. 1, the electrical contacts 160, the electronic components 110 and the dilatant layers 120 and 130 are disposed on one side of the substrate 102. In some other embodiments, the electrical contacts 160, the electronic components 110 and the dilatant layers 120 and 130 are disposed on both sides of the substrate 102.

In some embodiments, a difference in the CTEs of adjacent layers may be less than $10 \times 10^{-6}/°$ C. For example, the difference in the CTEs of adjacent layers may be referred to as the difference between the CTE of the dilatant layer 120 and the CTE of the conductive layer 116, the difference between the CTE of the dilatant layer 130 and the CTE of the conductive layer 112 or the insulation layer 140, or the difference between the CTE of the dielectric layer 114 and the CTE of the conductive layer 112 or 116. Thus, the undesired decrease of the capacitance of the electronic component 110 caused by thermal expansion may be avoided, and cracking or delamination of layers due to undesired significant CTE mismatch may be prevented. Table 1 shows some selections of the materials of the conductive layer 112, the conductive layer 116, the dielectric layer 114, the dilatant layer 120, or the dilatant layer 130.

TABLE 1

| Metal | CTE ($10^{-6}/°$ C.) | Non-metal | CTE ($10^{-6}/°$ C.) |
| --- | --- | --- | --- |
| Ag | 19-20 | $Al_2O_3$ | 8-10 |
| Ti | 9-10 | MgO | 13-14 |
| Al | 22-24 | $SiO_2$ | 0.5-0.8 |
| Cu | 16-18 | SiC | 4-6 |
| Ni | 13-15 | $Si_3N_4$ | 3-4 |
| Fe | 10-12 | Glass | 3-12 |
| Stainless Steel | 9-16 | Si | 4-5 |
| TiC | 7-8 | $Ta_2O_5$ | 1-3 |
| Au | 14-15 | $TiO_2$ | 7-12 |
| Pt | 8-9 | Graphene | −6 to −8 |

In some embodiments, the dilatant layers 120 and 130 are formed of or include Al or Ag, the conductive layers 112 and 116 are formed of or include Cu, and the dielectric layer 114 is formed of or includes $Al_2O_3$. In some embodiments, the dilatant layers 120 and 130 are formed of or include Al, the conductive layers 112 and 116 are formed of or include Ag, and the dielectric layer 114 is formed of or includes MgO. In some embodiments, the dilatant layers 120 and 130 are formed of or include Ni or Fe, the conductive layers 112 and 116 are formed of or include TiC, and the dielectric layer 114 is formed of or includes SiC or $Si_3N_4$. In some embodiments, the dilatant layers 120 and 130 are formed of or include Cu or Au, the conductive layers 112 and 116 are formed of or include Pt or Ti, and the dielectric layer 114 is formed of or includes $SiO_2$ or $Ta_2O_5$. In some embodiments, the dilatant layers 120 and 130 are formed of or include MgO, the conductive layers 112 and 116 are formed of or include Pt, and the dielectric layer 114 is formed of or includes $Ta_2O_5$. In some embodiments, the dilatant layers 120 and 130 are formed of or include $Ta_2O_5$, and the conductive layers 112 and 116 are formed of or include graphene.

Figure 2:
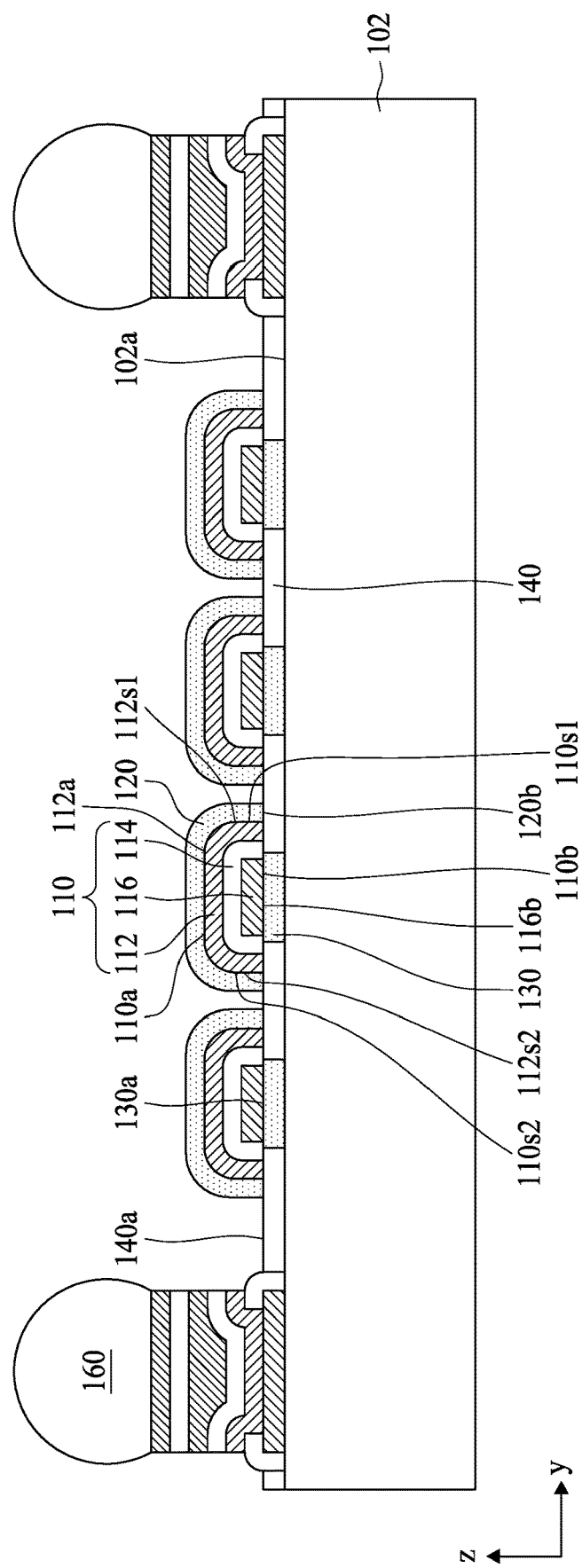
FIG. 2 illustrates a cross-sectional view of a semiconductor package in accordance with some embodiments of the present disclosure.

FIG. 2 illustrates a cross-sectional view of a semiconductor package 200 in accordance with some embodiments of the present disclosure. The semiconductor package 200 is similar to the semiconductor package 100 in FIG. 1 except that the dilatant layer 120 extends along two opposite lateral surfaces (e.g., surfaces 110s1 and 110s2) of the electronic component 110. In some embodiments, the dilatant layer 120 has a U-shaped cross-section covering the top surface (e.g., the surface 100a) and the two opposite lateral surfaces (e.g., surfaces 110s1 and 110s2) of the electronic component 110.

In some embodiments, the dilatant layer 120 extends along the surfaces 112s1 and 112s2 of the conductive layer 112. In some embodiments, the dilatant layer 120 is in contact with the surfaces 112s1 and 112s2 of the conductive layer 112. In some embodiments, the dilatant layer 120 surrounds a surface 112a (also referred to as "a top surface") and the surfaces 112s1 and 112s2 of the conductive layer 112. In some embodiments, the dilatant layer 120 is in contact with the surface 112a, the surface 112s1 and the surface 112s2 of the conductive layer 112. In accordance with the embodiments as shown in FIG. 2, the dilatant layer 120 may compress the electronic component 110 both in the y-direction from two opposite sides and in the z-direction downwardly, particularly the z-direction, when the temperature rises. The compression force applied from the dilatant layer 120 around the electronic component 110 may help to restrict the thermal expansion of the dielectric layer 114, and avoid undesired decrease of the capacitance of the electronic component 110.

Figure 3:
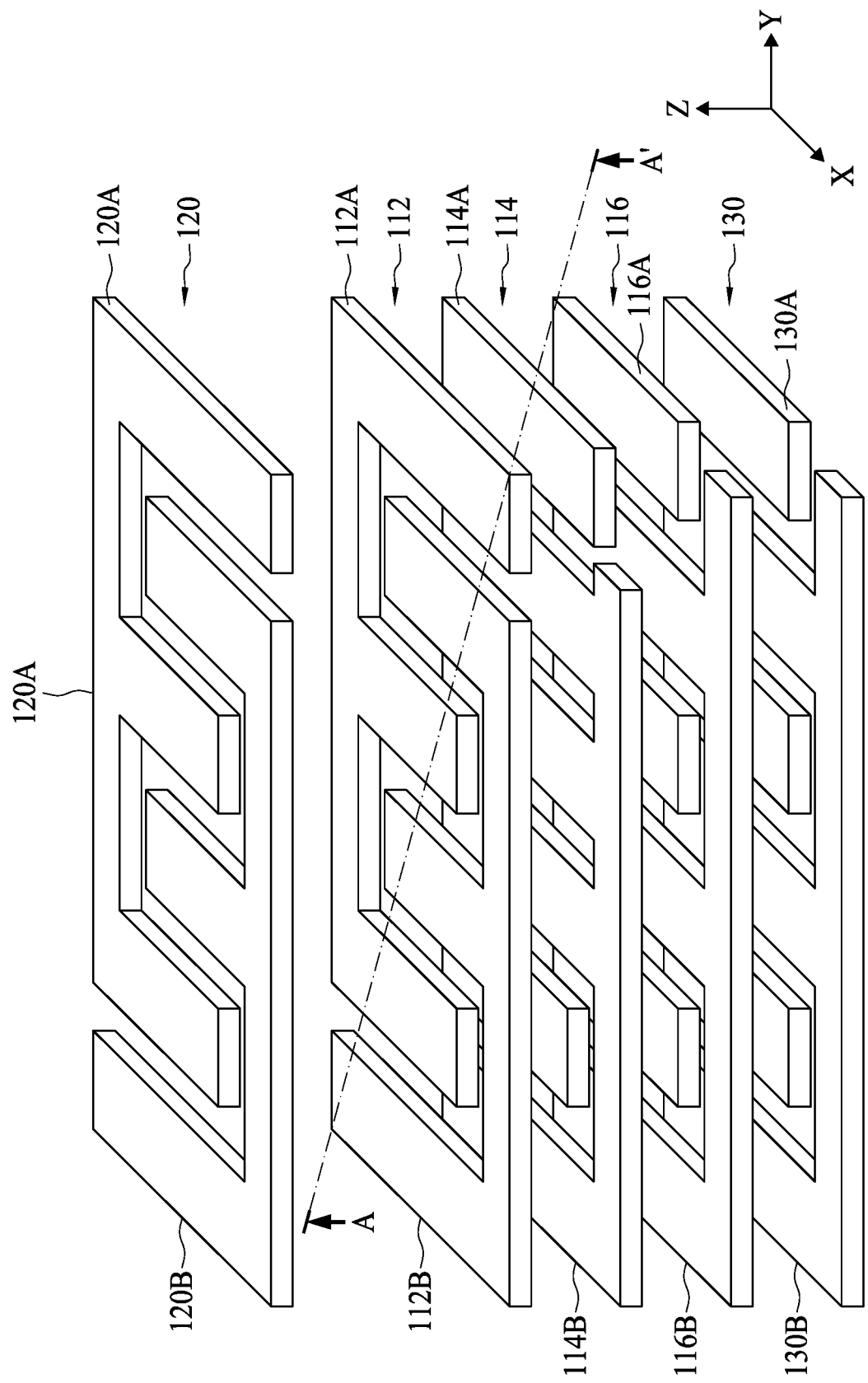
FIG. 3 illustrates an explosion diagram of an electronic component with two dilatant layers in accordance with some embodiments of the present disclosure.

FIG. 3 illustrates an explosion diagram of an electronic component 110 with two dilatant layers 120 and 130 in accordance with some embodiments of the present disclosure. The conductive layer 116 includes a set of fingers 116A having a first polarity and a set of fingers 116B having a second polarity opposite to the first polarity. The set of fingers 116A are interdigitated between the set of fingers 116B. The conductive layer 112 includes a set of fingers 112A having the second polarity and a set of fingers 112B having the first polarity. The set of fingers 112A are interdigitated between the set of fingers 112B. A pattern of the set of fingers 116A corresponds to a pattern of the set of the fingers 112A, and a pattern of the set of fingers 116B corresponds to a pattern of the set of the fingers 112B. In some embodiments, the dielectric layer 114 includes a set of fingers 114A and a set of fingers 114B interdigitated between the set of fingers 114A. A pattern of the set of fingers 114A corresponds to the pattern of the set of the fingers 112A, and a pattern of the set of fingers 114B corresponds to the pattern of the set of the fingers 112B. In some embodiments, the first polarity is positive polarity, and the second polarity is negative polarity. In some embodiments, the electronic component as shown in FIG. 3 may be or include a finger-type capacitor structure including multiple capacitors in series.

In some embodiments, the dilatant layer 120 includes a set of fingers 120A and a set of fingers 120B interdigitated between the set of fingers 120A. A pattern of the set of fingers 120A corresponds to the pattern of the set of the fingers 112A, and a pattern of the set of fingers 120B corresponds to the pattern of the set of the fingers 112B. In some embodiments, the dilatant layer 130 includes a set of fingers 130A and a set of fingers 130B interdigitated between the set of fingers 130A. A pattern of the set of fingers 130A corresponds to the pattern of the set of the fingers 112A, and a pattern of the set of fingers 130B corresponds to the pattern of the set of the fingers 112B.

Layers having large surface areas suffer from significant thermal expansion when the temperature changes (e.g., rises). In accordance with the embodiments as shown in FIG. 3, the pattern of the conductive layers 112 and 116 and the dielectric layer 114 having interdigitated fingers divides a large surface area into multiple small surface areas, and the smaller surface area indicates a smaller volume change when the temperature changes. Thus, the design of the finger-type pattern of the layers may help to avoid undesired decrease of the capacitance of the electronic component 110 caused by thermal expansion.

In some embodiments, the cross-sectional view along the cross-sectional line A-A' in FIG. 3 is illustrated in FIG. 1, FIG. 2, FIG. 4, FIG. 5 or FIG. 6. It should be noted that the actual sizes of the layers in the structure as shown in FIG. 3 may be slightly different from each other, and these differences are omitted in the figure for ease of description.

Figure 4:
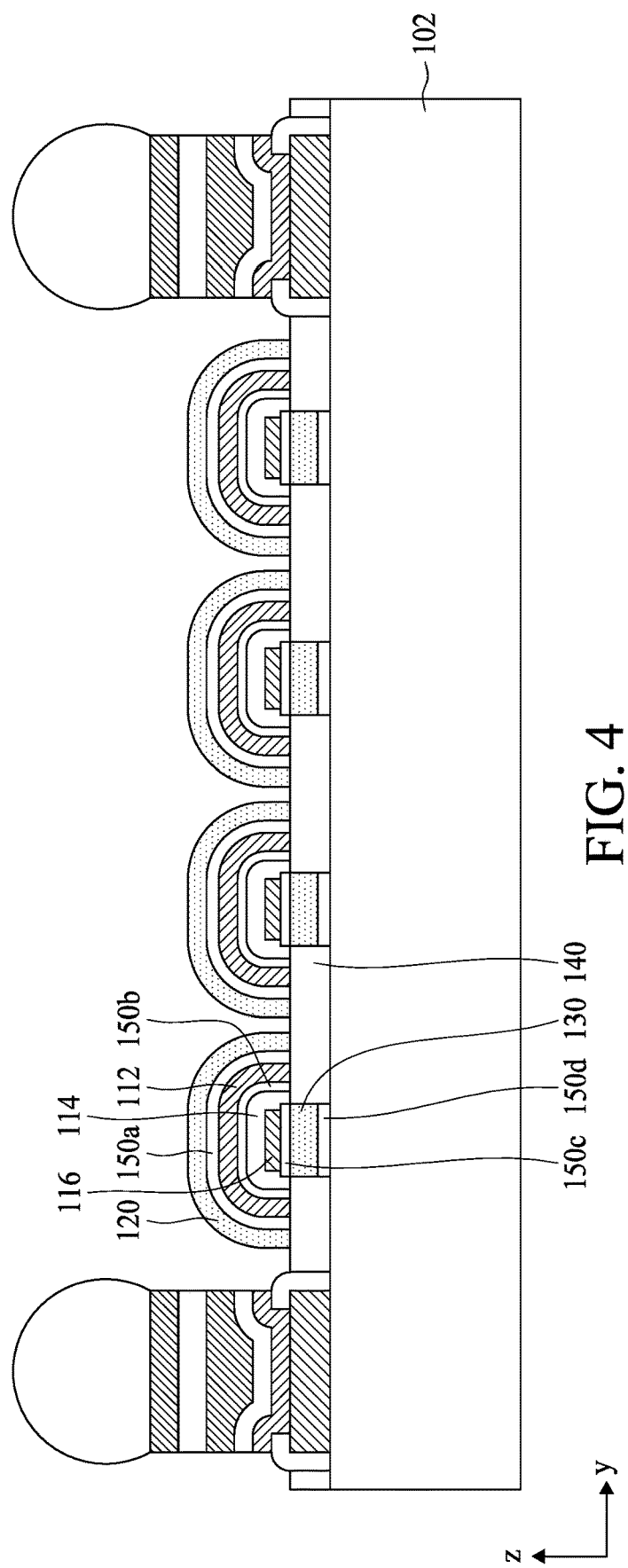
FIG. 4 illustrates a cross-sectional view of a semiconductor package in accordance with some embodiments of the present disclosure.

FIG. 4 illustrates a cross-sectional view of a semiconductor package 400 in accordance with some embodiments of the present disclosure. The semiconductor package 400 is similar to the semiconductor package 200 in FIG. 2, except that the semiconductor package 400 further includes one or more seed layers.

In some embodiments, a seed layer 150a is formed between the dilatant layer 120 and the conductive layer 112. In some embodiments, a seed layer 150b is formed between the conductive layer 112 and the dielectric layer 114. In some embodiments, a seed layer 150c is formed between the dielectric layer 114 and the dilatant layer 130. In some embodiments, a seed layer 150d is formed between the dilatant layer 130 and the substrate 102.

Figure 5:
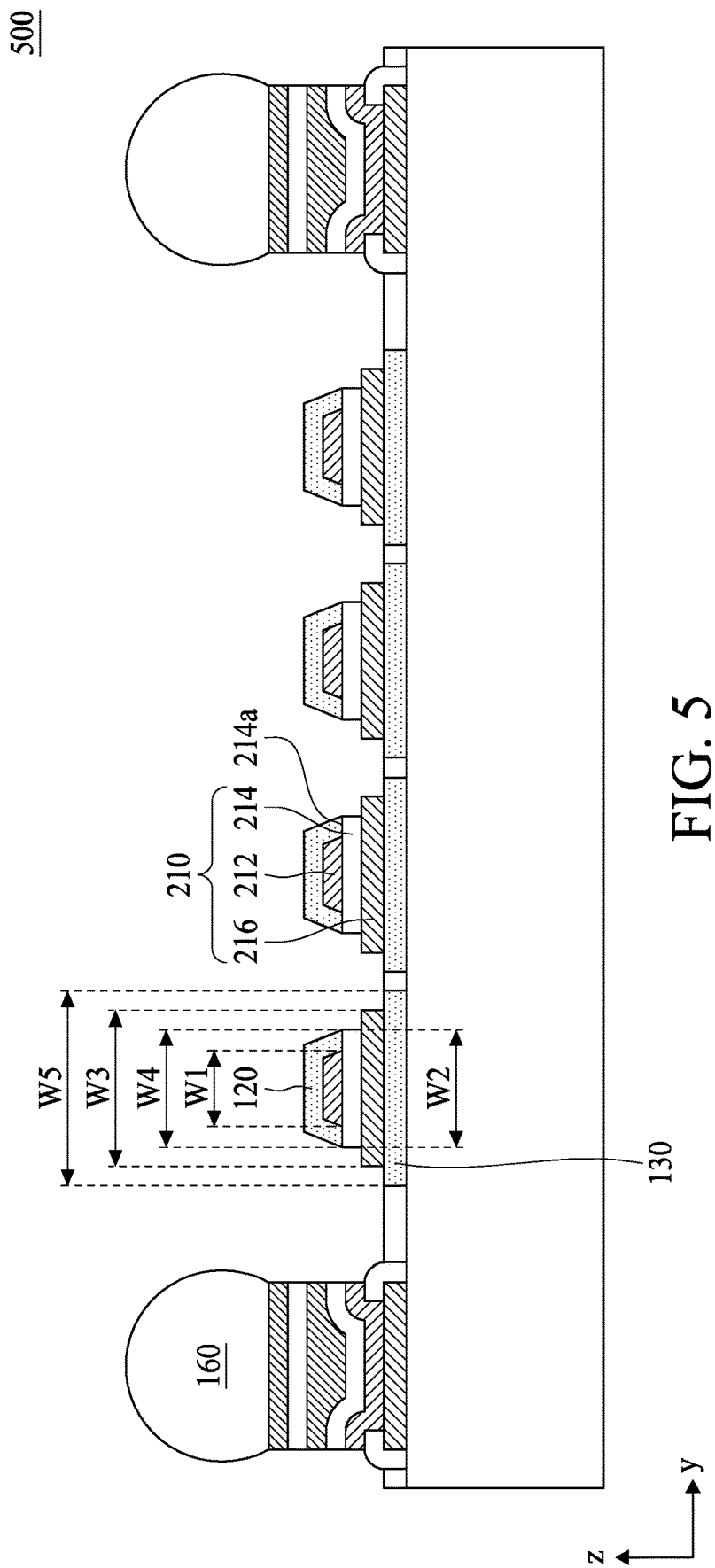
FIG. 5 illustrates a cross-sectional view of a semiconductor package in accordance with some embodiments of the present disclosure.

FIG. 5 illustrates a cross-sectional view of a semiconductor package 500 in accordance with some embodiments of the present disclosure. The semiconductor package 500 is similar to the semiconductor package 200 in FIG. 2, except for the structures of the electronic component 210 and the dilatant layer 120.

In some embodiments, the conductive layer 216 has a width W3 greater than a width W1 of the conductive layer 212. In some embodiments, the dielectric layer 214 has a width W2 greater than the width W1 of the conductive layer 212. In some embodiments, the width W3 of the conductive layer 216 is greater than the width W2 of the dielectric layer 214. In some embodiments, the dilatant layer 120 is in contact with a surface 214a (also referred to as "a top surface") of the dielectric layer 214. In some embodiments, the dilatant layer 120 is spaced apart from the conductive layer 216 by the dielectric layer 214. In some embodiments, the dilatant layer 120 has a width W4, and the dilatant layer 130 has a width W5 greater than the width W4 of the dilatant layer 120. In some embodiments, the width W5 of the dilatant layer 130 is greater than the width W3 of the conductive layer 216.

Figure 6:
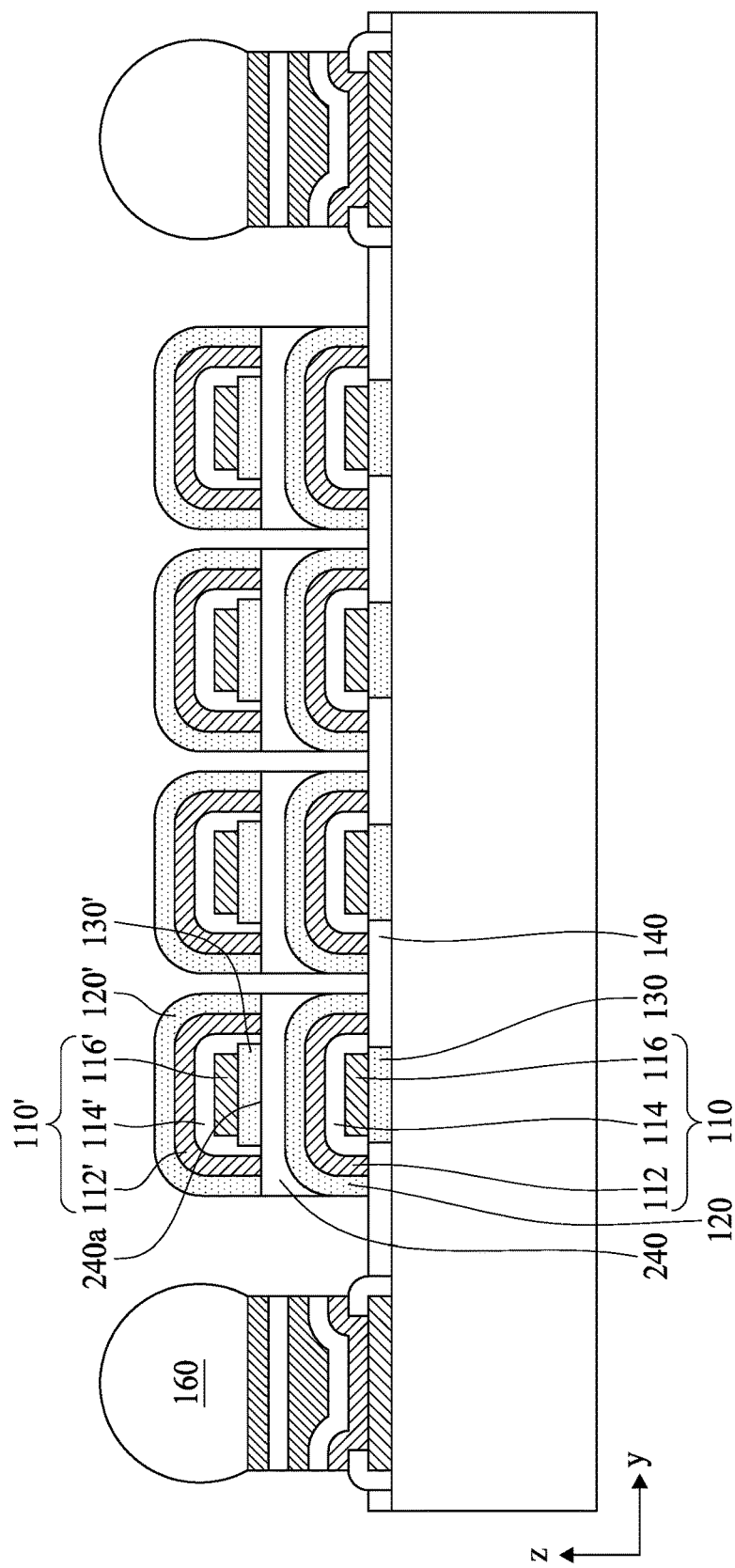
FIG. 6 illustrates a cross-sectional view of a semiconductor package in accordance with some embodiments of the present disclosure.

FIG. 6 illustrates a cross-sectional view of a semiconductor package 600 in accordance with some embodiments of the present disclosure. The semiconductor package 600 is similar to the semiconductor package 200 in FIG. 2, except that the semiconductor package 600 includes an electronic component 110' stacked on the electronic component 110.

In some embodiments, the semiconductor package 600 includes an insulation layer 240 disposed on the electronic component 110, and the electronic component 110' is disposed on the insulation layer 240. In some embodiments, the insulation layer 240 is in contact with the electronic component 110 and the electronic component 110'. In some embodiments, the insulation layer 240 is in contact with the dilatant layer 120. In some embodiments, the insulation layer 240 has a surface 240a (also referred to as "a top surface") that is substantially planar, and the electronic component 110' is disposed on the surface 240a of the insulation layer 240. In accordance with the embodiments as shown in FIG. 6, by stacking the electronic component 110' on the electronic component 110, more components can be arranged within a constrained layout area. In addition, the surface 240a of the insulation layer 240 provides a planarized top surface for the electronic component 110' to be disposed on, which facilitates the manufacturing process of the electronic component 110' and increases the yield of the overall structure.

In some embodiments, the electronic component 110' includes conductive layers 112' and 116' and a dielectric layer 114'. In some embodiments, the semiconductor package 600 further includes dilatant layers 120' and 130'. In some embodiments, the dilatant layer 130' is disposed in contact with the insulation layer 240. In some embodiments, the conductive layer 116' is disposed in contact with the dilatant layer 130'. In some embodiments, the dielectric layer 114' is disposed on the conductive layer 116', and the dielectric layer 114' is in contact with the conductive layer 116' and the dilatant layer 130'. In some embodiments, the dilatant layer 120' is disposed in contact with the conductive layer 112'. In some embodiments, the dilatant layer 120', the conductive layer 112', the dielectric layer 114' and the dilatant layer 130' are in contact with the insulation layer 240.

Figure 7A:
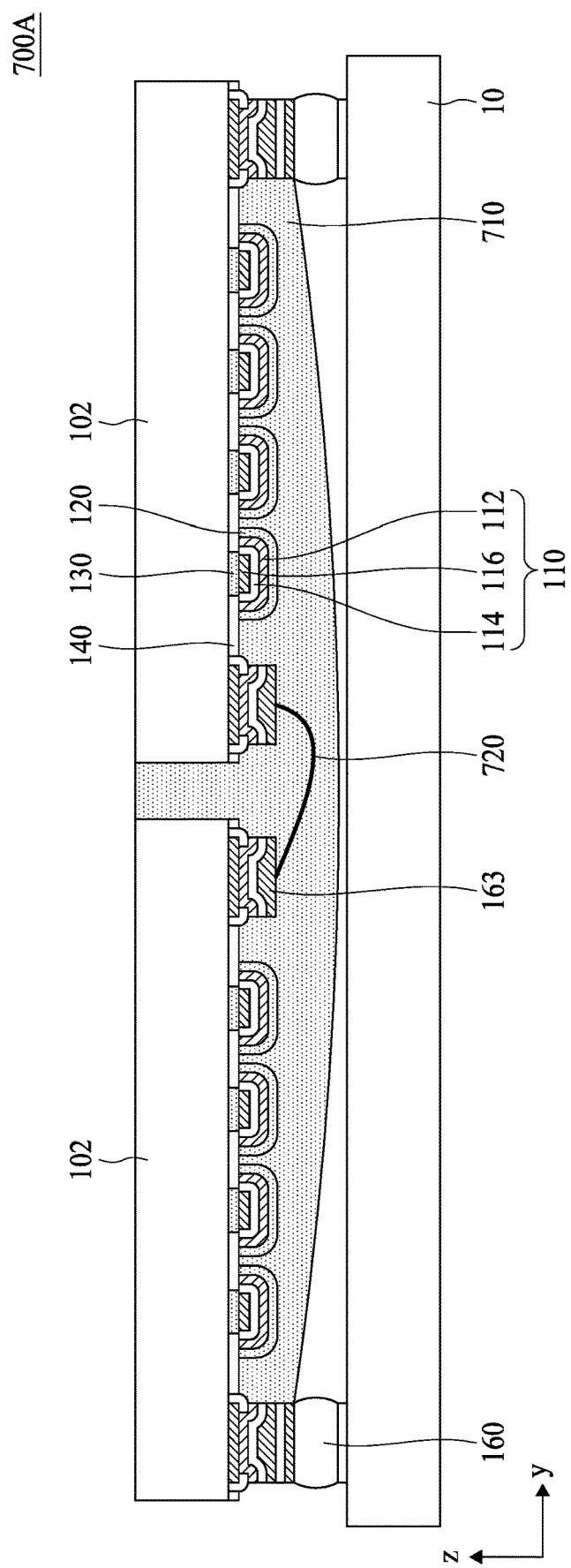
FIG. 7A illustrates a cross-sectional view of a semiconductor package in accordance with some embodiments of the present disclosure.

FIG. 7A illustrates a cross-sectional view of a semiconductor package 700A in accordance with some embodiments of the present disclosure. The semiconductor package 700A includes substrates 10 and 102, electronic components 110, dilatant layers 120 and 130, insulation layers 140, electrical contacts 160 and a protection layer 710. The electronic components 110 on different substrates 102 are electrically connected to each other through a wire bonding. The electronic components 110 on the substrates 102 are electrically connected to the substrate 10 through a solder ball (e.g., the electrical contact 160). The protection layer 710 covers the electronic components 110 and the bonding wire 720. In some embodiments, the protection layer 710 is in contact with the dilatant layers 120. In some embodiments, the protection layer 710 includes a molding compound. The molding compound may include, but is not limited to, an epoxy resin including fillers dispersed therein.

Figure 7B:
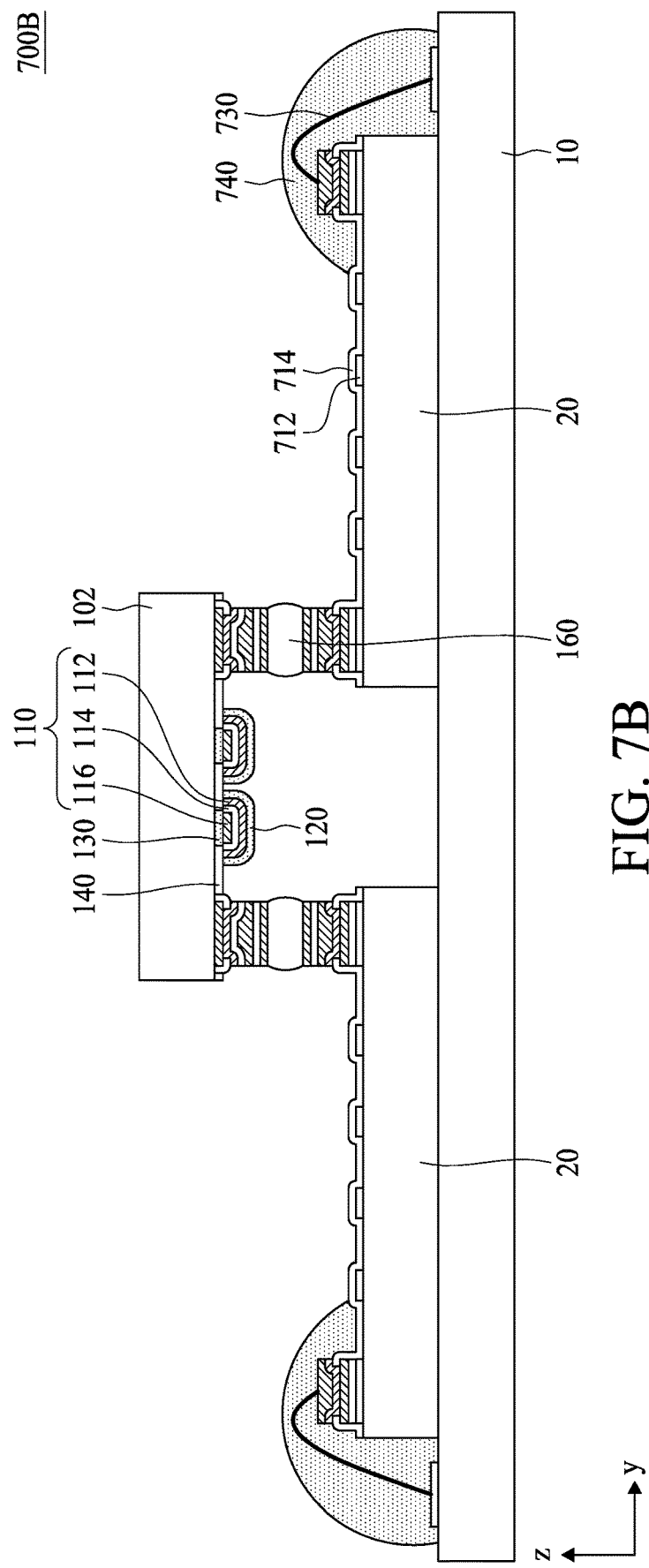
FIG. 7B illustrates a cross-sectional view of a semiconductor package in accordance with some embodiments of the present disclosure.

FIG. 7B illustrates a cross-sectional view of a semiconductor package 700B in accordance with some embodiments of the present disclosure. The semiconductor package 700B includes substrates 10, 20 and 102, electronic components 110, dilatant layers 120 and 130, insulation layers 140, electrical contacts 160, a conductive layer 712, and a protection layer 740. The electronic components 110 on the substrate 102 are electrically connected to the conductive layer 712 through a solder ball (e.g., the electrical contact 160). The conductive layer 712 on the substrate 20 is electrically connected to the substrate 10 through a wire bonding. The protection layer 740 covers the bonding wire 730. In some embodiments, a dielectric layer 714 covers the conductive layer 712. In some embodiments, the protection layer 740 includes a molding compound.

FIGS. 8A, 8B, 8C, 8D, 8E, 8F, 8G, 8H, 8I, 8J, 8K, 8L, 8M, 8N, 8O and 8P illustrate a method of manufacturing a semiconductor package 200 in accordance with some embodiments of the present disclosure. Various figures have been simplified for a better understanding of the aspects of the present disclosure.

Figure 8A:
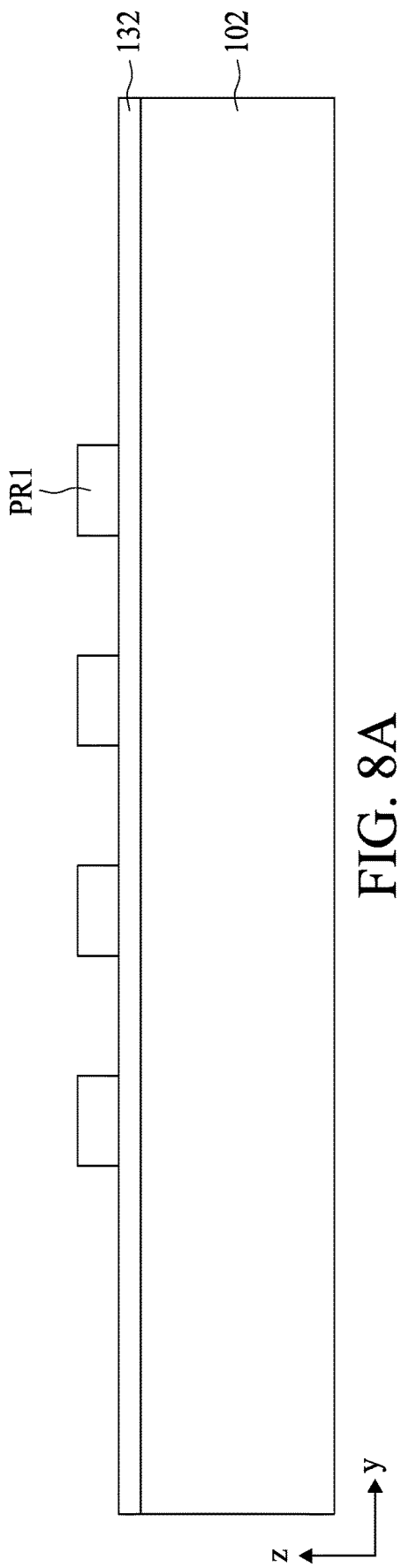

Referring to FIG. 8A, a substrate 102 is provided. A dilatant material 132 is then formed on the substrate 102. Then, a photoresist PR1 (e.g., mask) is disposed on the dilatant material 132. In some embodiments, the dilatant material 132 and the photoresist PR1 can be formed by the following operations: (i) disposing the dilatant material 132 on the substrate 102 by, for example, physical vapor deposition (PVD), chemical vapor deposition (CVD) or a coating process; (ii) disposing a photoresist material on the dilatant material 132 by, for example, a coating process; and (iii) performing exposing, developing and etching processes to form one or more openings within the photoresist material to form the patterned photoresist PR1. In some embodiments, the dilatant material 132 may have properties identical or similar to those of the dilatant layer 130 or 130' in FIG. 1, 2, 3, 4, 5, 6, 7A or 7B.

Figure 8B:
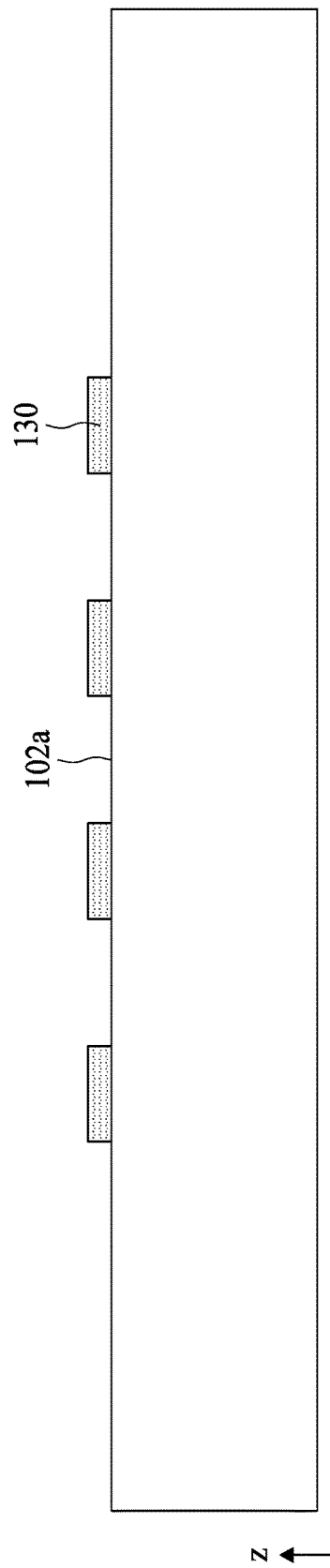

Referring to FIG. 8B, the dilatant material 132 is partially removed to form one or more openings to expose a portion of a top surface 102a of the substrate 102. The remaining portions of the dilatant material 132 under the photoresist PR1 form a dilatant layer 130 on the substrate 102. The photoresist PR1 is then removed. In some embodiments, the dilatant material 132 can be removed by, for example, a dry etching process.

Figure 8C:
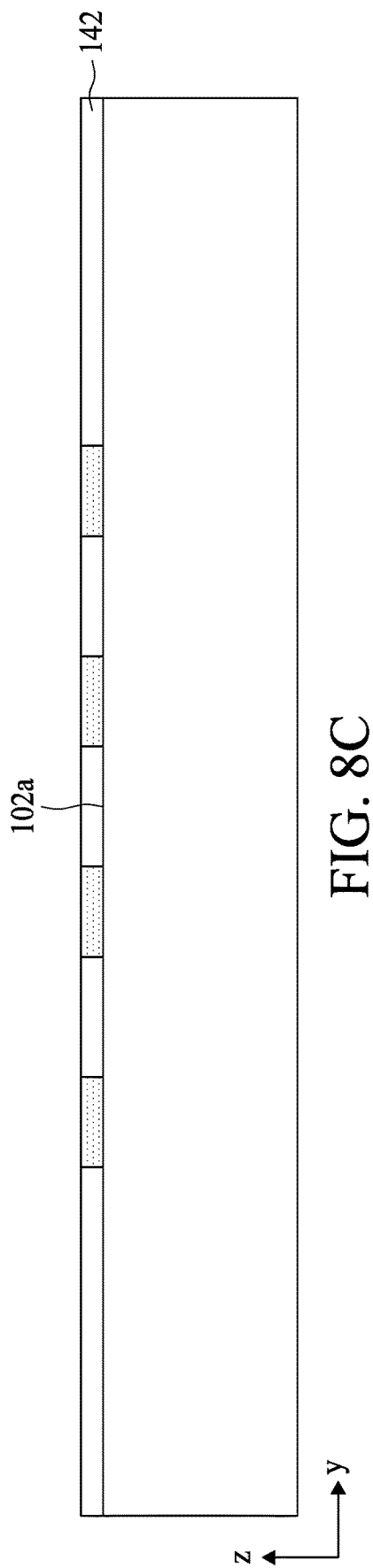

Referring to FIG. 8C, an insulation material 142 is formed on the surface 102a of the substrate 102 and within the openings of the dilatant layer 130. In some embodiments, the insulation material 142 can be deposited by, for example, a coating process, such as a spin coating process. In some embodiments, the insulation material 142 may have properties identical or similar to those of the insulation layer 140 or 240 in FIG. 1, 2, 3, 4, 5, 6, 7A or 7B.

In some other embodiments, after the dilatant material 132 is partially removed to form one or more openings to expose a portion of the top surface 102a of the substrate 102 and before the photoresist PR1 is removed, an insulation material may be deposited on the photoresist PR1 and the exposed portion of the top surface 102a of the substrate 102 by, for example, a coating process, such as a spin coating process. Then the photoresist PR1 may be removed, and the portions of the insulation material deposited on the photoresist PR1 may be removed together with the photoresist PR1, such that the remaining portions of the insulation material within the openings of the dilatant layer 130 form the insulation layer 142 as shown in FIG. 8C. With the above operation in accordance with some embodiments of the present disclosure, the dilatant layer 130 can covered by the photoresist PR1 in the coating process of the insulation material, such that the insulation material spraying onto the top surface (e.g., surface 130a) of the dilatant layer 130 caused by a high speed of the spin coating process of the insulation material can be prevented. In other words, the process window of the control over the speed of the spin coating process of the insulation material can be larger, and thus difficulty of the manufacturing process of the formation of the insulation material 132 can be reduced.

Figure 8D:
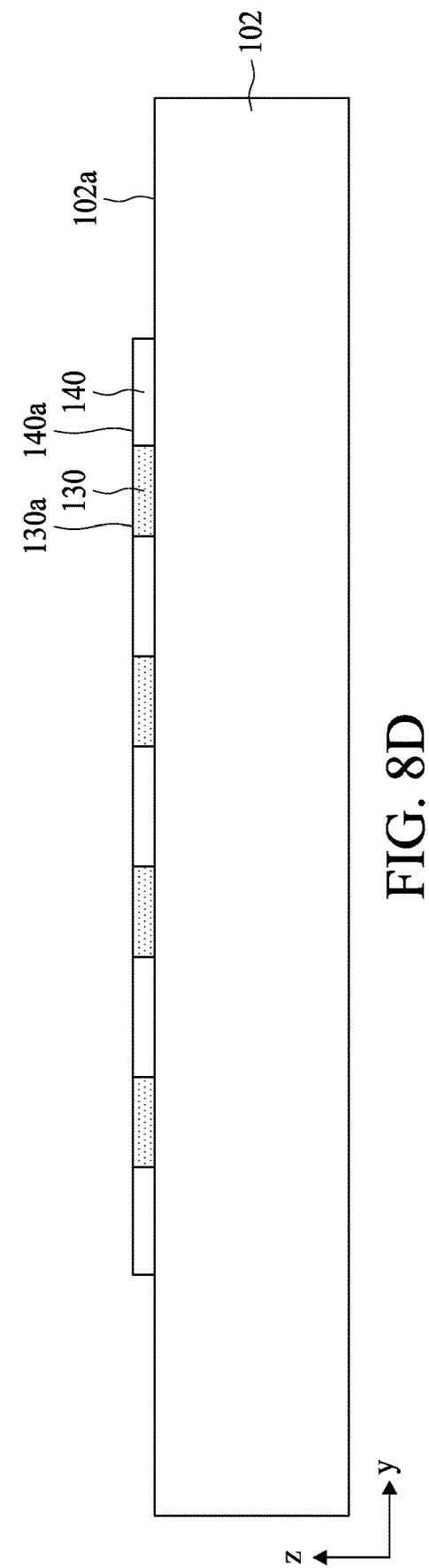

Referring to FIG. 8D, the insulation material 142 is partially removed to form the insulation layer 140 on the substrate 102 and within the openings of the dilatant layer 130. In some embodiments, the insulation material 142 can be partially removed by performing exposing, developing and etching processes on the insulation material 142 to expose a portion of the surface 102a of the substrate 102 and a surface 130a (also referred to as "a top surface") of the dilatant layer 130. In some embodiments, the surface 130a is substantially coplanar with a surface 140a (also referred to as "a top surface") of the insulation layer 140. In some embodiments, the insulation layer 140 is formed to surround the dilatant layer 130.

Figure 8E:
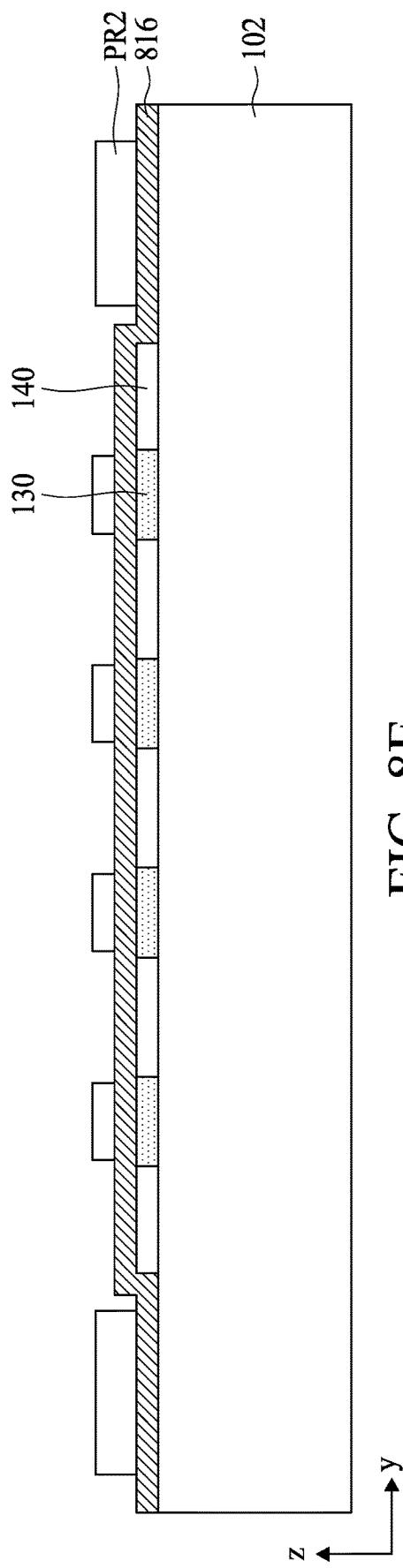

Referring to FIG. 8E, a conductive layer 816 is then formed on the dilatant layer 130 and the insulation layer 140. A photoresist PR2 is then formed on the conductive layer 816, and the photoresist PR2 has one or more openings to expose a portion of the conductive layer 816. In some embodiments, the conductive layer 816 covers the dilatant layer 130 and the insulation layer 140. In some embodiments, the conductive layer 816 can be formed by, for example, PVD or plating. In some embodiments, the conductive layer 816 may have properties identical or similar to those of the conductive layer 116, 116', 216 or 316 in FIG. 1, 2, 3, 4, 5, 6, 7A or 7B.

Figure 8F:
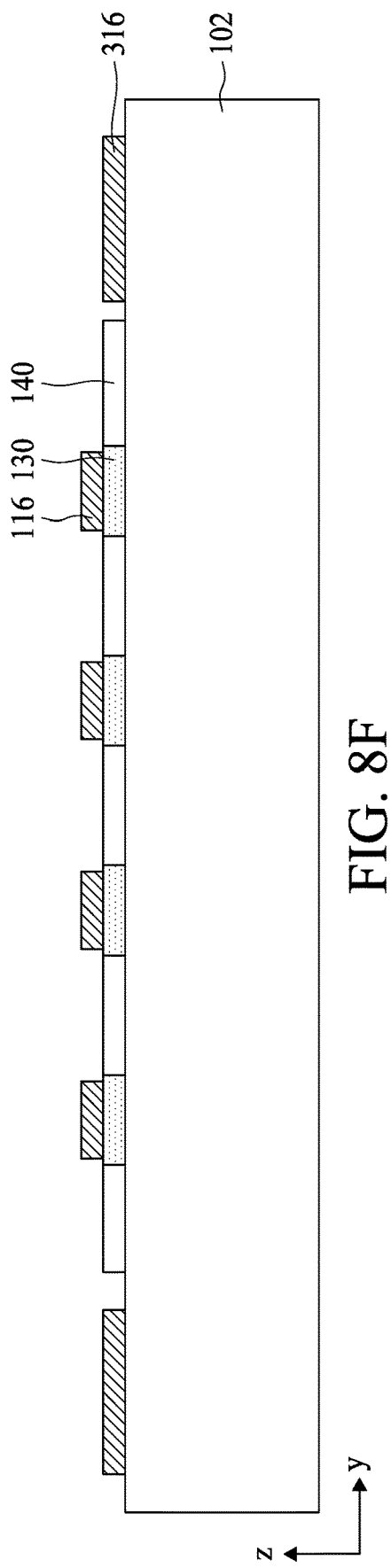

Referring to FIG. 8F, the conductive layer 816 is partially removed, and the remaining portions of the conductive layer 816 under the photoresist PR2 form a conductive layer 116 on the dilatant layer 130 and a conductive layer 316 on the substrate 102. The photoresist PR2 is then removed. In some embodiments, the conductive layer 816 can be removed by, for example, a dry etching process.

Referring to FIG. 8G, a dielectric layer 814 is then formed on the conductive layers 116 and 316, the dilatant layer 130 and the insulation layer 140. A photoresist PR3 is then formed on the dielectric layer 814, and the photoresist PR3 has one or more openings to expose a portion of the dielectric layer 814. In some embodiments, the dielectric layer 814 covers the conductive layers 116 and 316, the dilatant layer 130 and the insulation layer 140. In some embodiments, the dielectric layer 814 can be formed by, for example, coating. In some embodiments, the dielectric layer 814 may have properties identical or similar to those of the dielectric layer 114, 114', 214 or 314 in FIG. 1, 2, 3, 4, 5, 6, 7A or 7B.

Referring to FIG. 8H, the dielectric layer 814 is partially removed, and the remaining portions of the dielectric layer 814 under the photoresist PR3 form a dielectric layer 114 on the conductive layer 116 and a dielectric layer 314 adjacent to the conductive layer 316. The photoresist PR3 is then removed. In some embodiments, the dielectric layer 814 can be removed by, for example, a dry etching process.

Referring to FIG. 8I, a conductive layer 812 is then formed on the dielectric layers 114 and 314, the conductive layer 316 and the insulation layer 140. A photoresist PR4 is then formed on the conductive layer 812, and the photoresist PR4 has one or more openings to expose a portion of the conductive layer 812. In some embodiments, the conductive layer 812 covers the dielectric layers 114 and 314, the conductive layer 316 and the insulation layer 140. In some embodiments, the conductive layer 812 can be formed by, for example, PVD or plating. In some embodiments, the conductive layer 812 may have properties identical or similar to those of the conductive layer 112, 112', 212 or 312 in FIG. 1, 2, 3, 4, 5, 6, 7A or 7B.

Referring to FIG. 8J, the conductive layer 812 is partially removed, and the remaining portions of the conductive layer 812 under the photoresist PR4 form a conductive layer 112 on the dielectric layer 114 and a conductive layer 312 on the conductive layer 316. The photoresist PR4 is then removed. In some embodiments, the conductive layer 812 can be removed by, for example, a dry etching process.

Figure 8K:
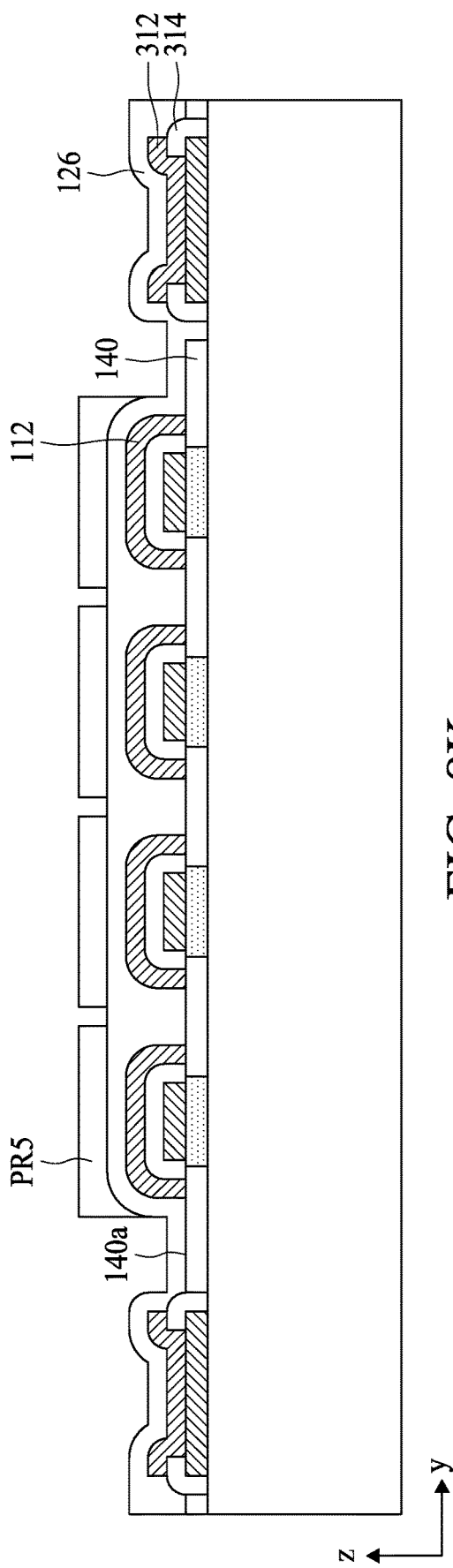

Referring to FIG. 8K, a dilatant material 126 is formed on the conductive layer 112 and the insulation layer 140. A photoresist PR5 is then formed on the dilatant material 126, and the photoresist PR5 has one or more openings to expose a portion of the dilatant material 126. In some embodiments, the dilatant material 126 covers the dielectric layer 314, the conductive layers 112 and 312 and the insulation layer 140. In some embodiments, the dilatant material 126 can be formed by, for example, PVD, CVD or a coating process. In some embodiments, the dilatant material 126 may have properties identical or similar to those of the dilatant layer 120 or 120' in FIG. 1, 2, 3, 4, 5, 6, 7A or 7B.

Figure 8L:
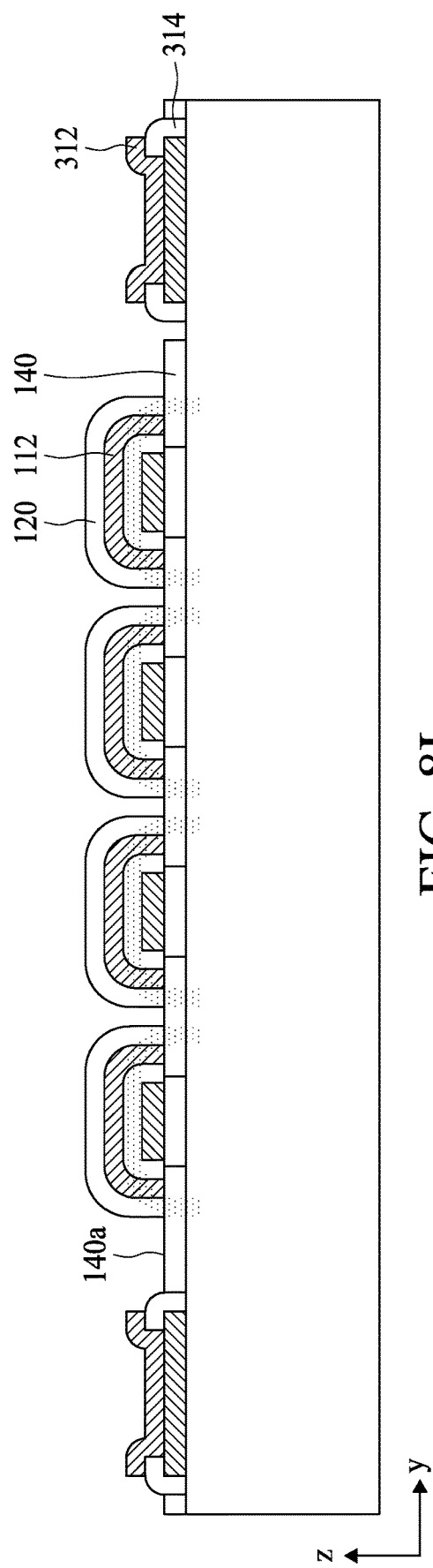

Referring to FIG. 8L, the dilatant material 126 is partially removed to expose a portion of the top surface (e.g., surface 104a) of the insulation layer 140. The remaining portions of the dilatant material 126 under the photoresist PR5 form a dilatant layer 120 on the conductive layer 112. In some embodiments, the dilatant material 126 is partially removed to expose the dielectric layer 314 and the conductive layer 312. The photoresist PR5 is then removed. In some embodiments, the dilatant material 126 can be removed by, for example, a dry etching process.

Figure 8M:
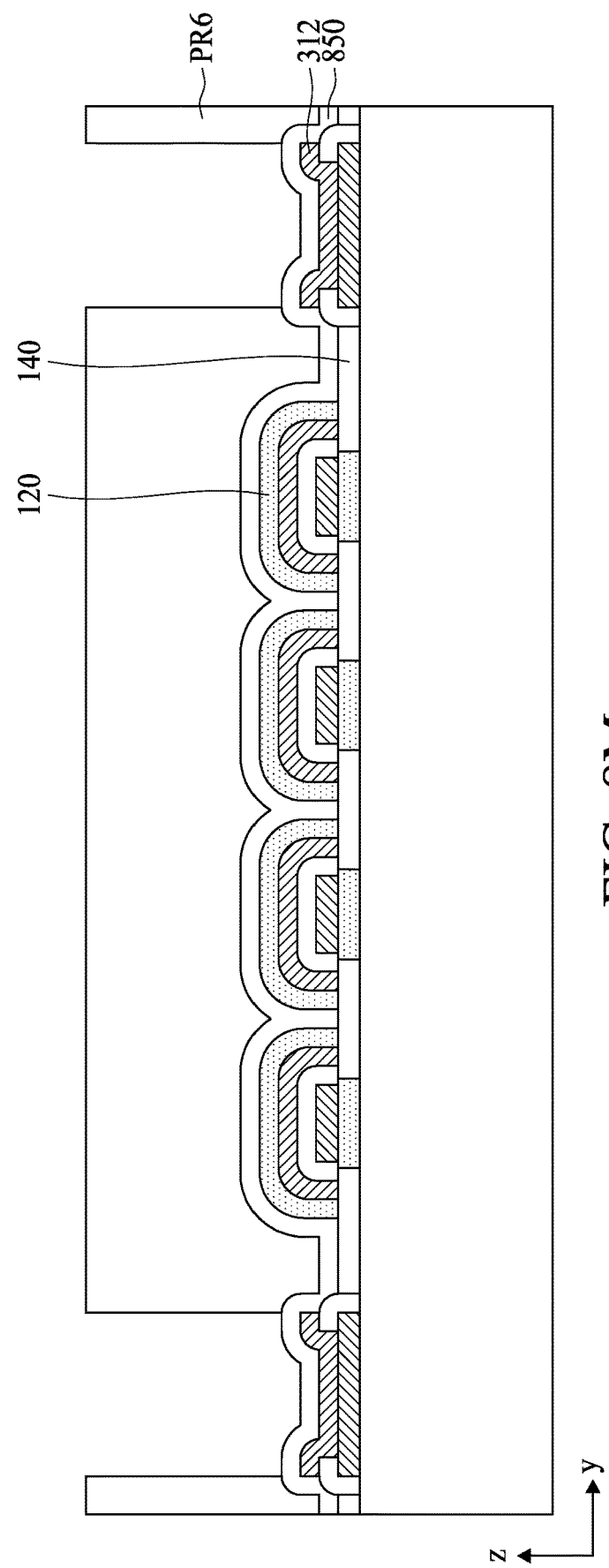

Referring to FIG. 8M, a seed layer 850 is formed on the conductive layer 312, the dilatant layer 120 and the insulation layer 140. A photoresist PR6 is then formed on the seed layer 850, and the photoresist PR6 has one or more openings to expose a portion of the seed layer 850. In some embodiments, the photoresist PR6 can be formed by the following operations: (i) disposing a photoresist material on the seed layer 850 by, for example, a coating process; and (ii) performing exposing, developing and etching processes to form one or more openings within the photoresist material to form the patterned photoresist PR6. In some embodiments, the seed layer 850 may have properties identical or similar to those of the seed layer 250 in FIG. 1, 2, 3, 4, 5, 6, 7A or 7B.

Figure 8N:
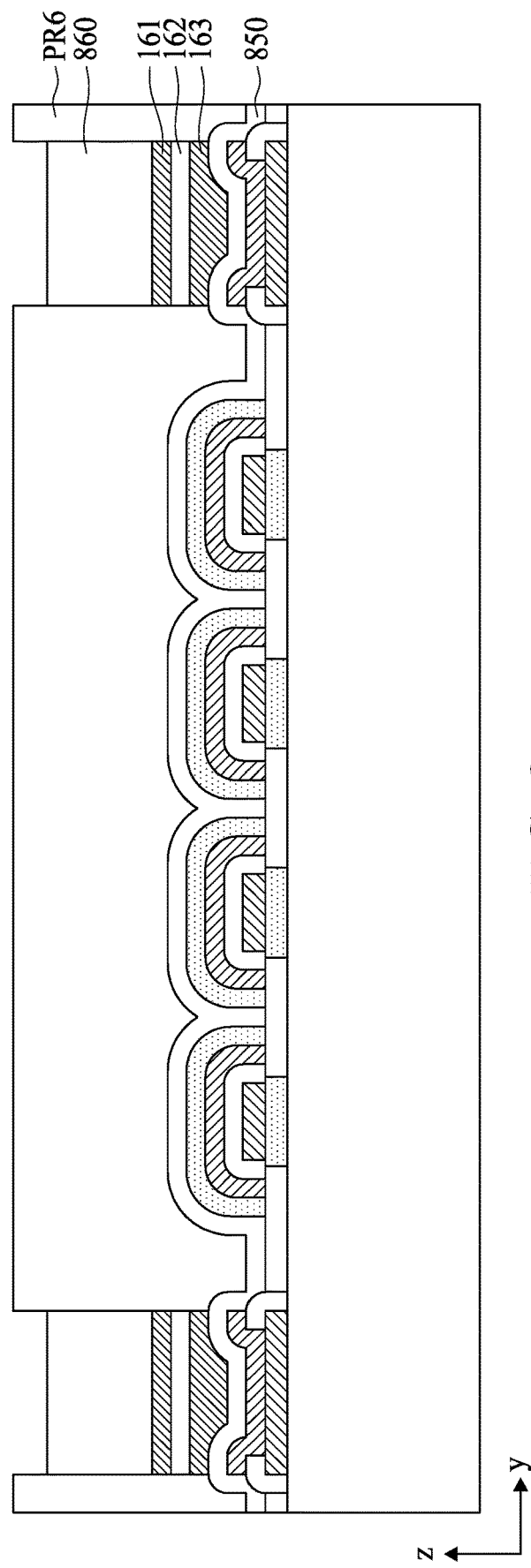
Figure 80:
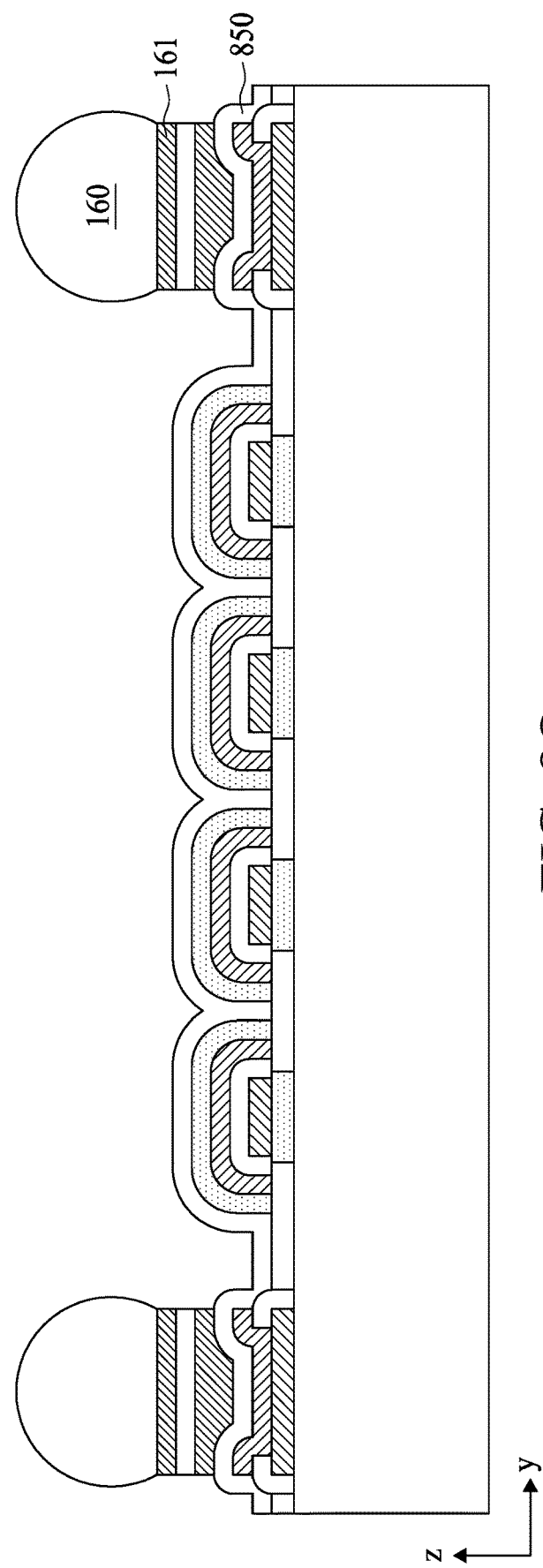

Referring to FIG. 8N, a conductive layer 163 is formed on the seed layer 850 and within the one or more openings of the photoresist PR6. A barrier layer 162 is then formed on the conductive layer 163. A conductive layer 161 is then formed on the barrier layer 162. A conductive layer 860 is then formed on the conductive layer 161. In some embodiments, the conductive layer 161, the barrier layer 162, the conductive layer 163, or the conductive layer 850 can be formed by, for example, PVD or plating.

Referring to FIG. 8O, the photoresist PR6 is removed. A reflow process is performed on the conductive layer 860 to form an electrical contact 160 on the conductive layer 161.

Figure 8P:
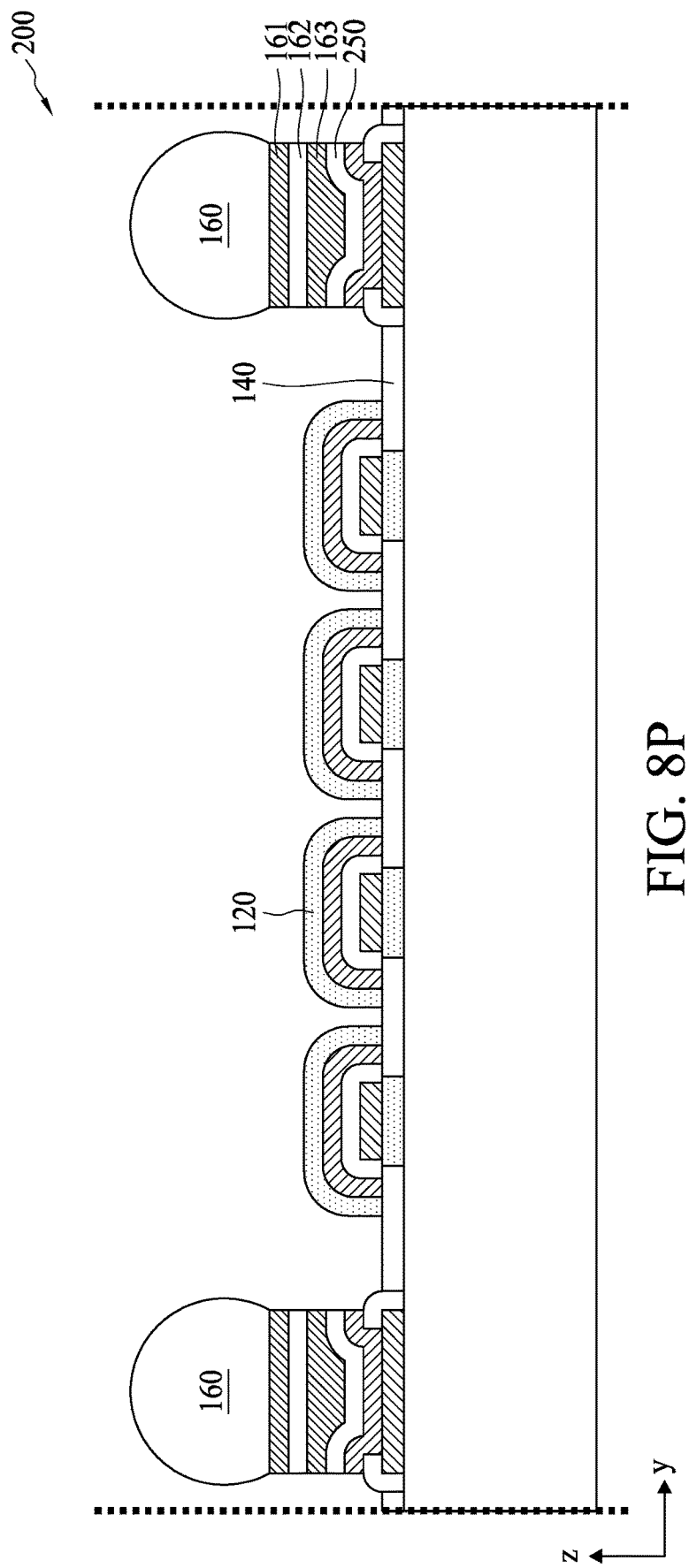

Referring to FIG. 8P, the seed layer 850 is partially removed to expose the dilatant layer 120 and the insulation layer 140. The portion remaining under the conductive layer 163 forms a seed layer 250. In some embodiments, singulation may be performed to separate out individual semiconductor packages including the semiconductor package 200.

In some embodiments, a plurality of chips and/or dies are placed on a square-shaped carrier or a circle-shaped carrier. In some embodiments, at least one of the chips may include the semiconductor package 100, 200, 400, 500, 600, 700A or 700B as show in FIG. 1, 2, 4, 5, 6, 7A or 7B. In some embodiments, the square-shaped or circle-shaped carrier may include organic materials (e.g., molding compound, BT, PI, PBO, solder resist, ABF, PP, epoxy-based material, or a combination of two or more thereof) or inorganic materials (e.g., silicon, glass, ceramic, quartz, or a combination of two or more thereof).

As used herein, the terms "approximately," "substantially," "substantial" and "about" are used to describe and account for small variations. When used in conjunction with an event or circumstance, the terms can refer to instances in which the event or circumstance occurs precisely, as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt to a particular situation, material, composition of matter, method, or process regarding the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package, comprising:
   a substrate;
   an electronic component disposed on the substrate, wherein the electronic component has a top surface, a bottom surface opposite to the top surface and a lateral surface extending between the top surface and the bottom surface, the electronic component comprising:
      a first conductive layer disposed on the substrate;
      a dielectric layer disposed on the first conductive layer and surrounding the first conductive layer; and
      a second conductive layer disposed on the dielectric layer and surrounding the dielectric layer; and
   a first dilatant layer disposed on the top surface of the electronic component and extending along the lateral surface of the electronic component.

2. The semiconductor package as claimed in claim 1, wherein the first dilatant layer extends along a lateral surface of the second conductive layer and covers at least a portion of the lateral surface of the second conductive layer.

3. The semiconductor package as claimed in claim 1, wherein the first dilatant layer has a coefficient of thermal expansion (CTE) greater than a CTE of the second conductive layer.

4. The semiconductor package as claimed in claim 3, wherein the CTE of the second conductive layer is greater than a CTE of the dielectric layer.

5. The semiconductor package as claimed in claim 1, further comprising:
   a second dilatant layer disposed between the first conductive layer and the substrate.

6. The semiconductor package as claimed in claim 5, wherein the first dilatant layer and the second dilatant layer are formed of the same material.

7. The semiconductor package as claimed in claim 5, wherein the first dilatant layer has a first cross-sectional area along a line perpendicular to a top surface of the substrate, the second dilatant layer has a second cross-sectional area along the line perpendicular to the top surface of the substrate, and the first cross-sectional area is greater than the second cross-sectional area.

8. The semiconductor package as claimed in claim 1, wherein
the first conductive layer comprises a first set of fingers having a first polarity and a second set of fingers having a second polarity opposite to the first polarity;
the first set of fingers are interdigitated between the second set of fingers;
the second conductive layer comprises a third set of fingers having the second polarity and a fourth set of fingers having the first polarity;
the third set of fingers are interdigitated between the fourth set of fingers; and
a pattern of the first set of fingers corresponds to a pattern of the third set of fingers, and a pattern of the second set of fingers corresponds to a pattern of the fourth set of fingers.

9. The semiconductor package as claimed in claim 2, wherein the first dilatant layer fully covers the lateral surface of the second conductive layer.

10. The semiconductor package as claimed in claim 5, wherein the first conductive layer is in direct contact with the second dilatant layer.

11. A semiconductor package, comprising:
a substrate;
an electronic component disposed on the substrate, the electronic component comprising:
a first conductive layer disposed on the substrate;
a dielectric layer disposed on the first conductive layer and surrounding the first conductive layer; and
a second conductive layer disposed on the dielectric layer and surrounding the dielectric layer; and
a first dilatant layer disposed on the second conductive layer of the electronic component;
wherein the first dilatant layer has a coefficient of thermal expansion (CTE) that is greater than a CTE of the second conductive layer.

12. The semiconductor package as claimed in claim 11, wherein the CTE of the first dilatant layer is greater than a CTE of the dielectric layer.

13. The semiconductor package as claimed in claim 11, further comprising:
a second dilatant layer disposed between the first conductive layer and the substrate.

14. The semiconductor package as claimed in claim 13, wherein the second dilatant layer has a CTE that is different from the CTE of the first dilatant layer.

15. The semiconductor package as claimed in claim 13, further comprising:
an insulation layer disposed on the substrate and adjacent to the second dilatant layer, wherein the insulation layer has a CTE that is less than a CTE of the second dilatant layer.

16. The semiconductor package as claimed in claim 11, wherein
the first conductive layer comprises a first set of fingers having a first polarity and a second set of fingers having a second polarity opposite to the first polarity;
the first set of fingers are interdigitated between the second set of fingers;
the second conductive layer comprises a third set of fingers having the second polarity and a fourth set of fingers having the first polarity;
the third set of fingers are interdigitated between the fourth set of fingers;
a pattern of the first set of fingers corresponds to a pattern of the third set of fingers, and a pattern of the second set of fingers corresponds to a pattern of the fourth set of fingers.

17. The semiconductor package as claimed in claim 11, wherein the first dilatant layer is in direct contact with the second conductive layer and the dielectric layer.

18. The semiconductor package as claimed in claim 12, wherein the CTE of the second conductive layer is equal to or greater than the CTE of the dielectric layer.

19. The semiconductor package as claimed in claim 13, wherein the first dilatant layer and the second dilatant layer are formed of the same material.

* * * * *